United States Patent [19]

Yamamoto

[11] 4,450,469

[45] May 22, 1984

[54] MESA TYPE SEMICONDUCTOR DEVICE WITH GUARD RING

[75] Inventor: Takeski Yamamoto, Itami, Japan

[73] Assignee: Mitsubishi Denki Kabushiki Kaisha, Tokyo, Japan

[21] Appl. No.: 228,637

[22] Filed: Jan. 26, 1981

[30] Foreign Application Priority Data

Mar. 10, 1980 [JP] Japan ............................ 55-30649

[51] Int. Cl.³ .................. H01L 29/74; H01L 29/34; H01L 29/06
[52] U.S. Cl. ........................... 357/56; 357/38; 357/52; 357/55
[58] Field of Search ........... 357/52, 56, 13, 53, 357/38 P, 52 D, 52 T, 38, 55

[56] References Cited

U.S. PATENT DOCUMENTS

| | | | |
|---|---|---|---|
| 3,341,380 | 9/1967 | Mets et al. | 357/13 |
| 4,003,072 | 1/1977 | Matsushita et al. | 357/13 |
| 4,305,085 | 12/1981 | Jarcklin et al. | 357/13 |
| 4,377,816 | 3/1983 | Sittig | 357/38 |

FOREIGN PATENT DOCUMENTS 54-101279  8/1979  Japan ............................ 357/55

*Primary Examiner*—Martin H. Edlow
*Assistant Examiner*—Jerome Jackson
*Attorney, Agent, or Firm*—C. L. Menzemer

[57] ABSTRACT

The present invention is directed to a mesa type semiconductor device, formed in a body of semiconductor material, containing at least one guard ring region. The at least one guard ring region is formed to a relatively shallow depth within the body thereby reducing the height of the mesa above the main portion of the body of semiconductor material. The resultant device is physically stronger than prior art devices.

3 Claims, 6 Drawing Figures

FIG. 3
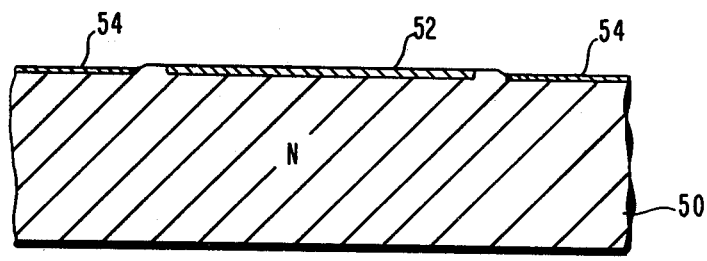
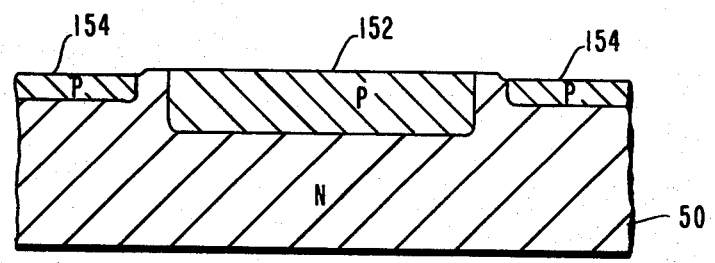
FIG. 4
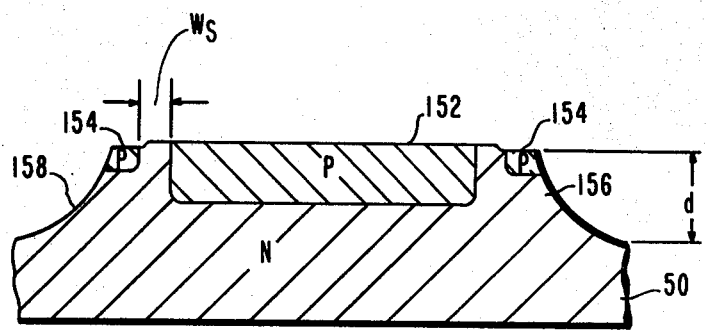
FIG. 5

MESA TYPE SEMICONDUCTOR DEVICE WITH GUARD RING

BACKGROUND OF THE INVENTION

1. Field of the Invention

The present invention is in the field of semiconductor devices generally and is specifically directed to mesa type diodes and thyristors which utilize guard rings to increase their voltage capability.

2. Description of the Prior Art

With reference to FIG. 1, there is shown a prior art mesa type diode 10 with a guard ring to enable the diode to withstand high voltages.

The diode of FIG. 1 comprises an n-type cathode region 12 and a p-type anode region 14 with a p-n junction 16 therebetween. The diode 10 has a p-type guard ring region 18 spaced apart from the p-type anode region 14. There is chamfer or bevel 20 extending from top surface 22 along edge 24. The chamfer or bevel 20 has a depth "d".

Typically, in preparing the diode 10, starting with a body of n-type silicon having for example, a resistivity of about 80 ohm-cm, p-type regions 14 and 18 are formed by diffusion through surface 22. Since the regions 14 and 18 are formed during the same diffusion they will have essentially the same depth, which for a diode capable of withstanding 1600-1800 volts will be about 55μ to 65μ. The spacing $W_s$ between regions 14 and 18 along the surface 22 is about 50μ.

The chamfer or bevel 20 is then formed by chemical etching. The chamfer or bevel typically will extend along edge 24 for a vertical distance approximately equal to twice the depth of region 18 from 110μ to 130μ.

It is obvious that if the starting body of n-type silicon had an original thickness of about 145μ that the finished diode 10 will be relatively fragile and easily broken during handling.

This problem is even more acute when a mesa type thyristor is made with guard rings.

With reference to FIG. 2, there is shown a prior art thyristor 30.

The thyristor 30 is comprised of a cathode emitter, n-type, region 32, a p-type cathode base region 34, an n-type anode base region 36, and a p-type anode emitter region 38.

There is a p-n junction 40 between regions 32 and 34, a p-n junction 42 between regions 34 and 36 and a p-n junction 44 between regions 36 and 38. The thyristor 30 also contains a first guard ring region 40 and a second guard ring region 42.

In the usual process of making the thyristor 30, p-type regions 34, 38, 40 and 42 are formed at the same time and thus will have the same thickness or depth. Consequently, chamfers or bevels 46 and 48 each formed to twice the depth or the guard ring regions 40 and 42 respectively results in a very physically fragile body of semiconductor material which can be easily broken while handling.

SUMMARY OF THE INVENTION

The present invention comprises a semiconductor device comprised of a body of semiconductor material, said body having of a top surface, a bottom surface and an edge portion extending between said top and said bottom surface, a first region having a first type conductivity extending from a portion of said top surface into said body to a depth less than the thickness of said body, a second region of a second type of conductivity, said second region forming a p-n junction with said first region, said second region extending to said top surface around said first region, a third region, said third region having said first type of conductivity, said third region extending from said top surface into said body to a depth less than the depth of said first region, said third region being spaced apart from said first region along said top surface by said second region, the edge portion of said body being beveled at least from said top surface to a depth equal to twice the depth of said third region.

BRIEF DESCRIPTION OF THE DRAWINGS

For a better understanding of the nature of the present invention reference should be had to the following detailed description and drawings in which:

FIGS. 3 to 5 are side views of a body of semiconductor material being processed in accordance with the teachings of this invention.

DESCRIPTION OF THE PREFERRED EMBODIMENT

Figure 1:
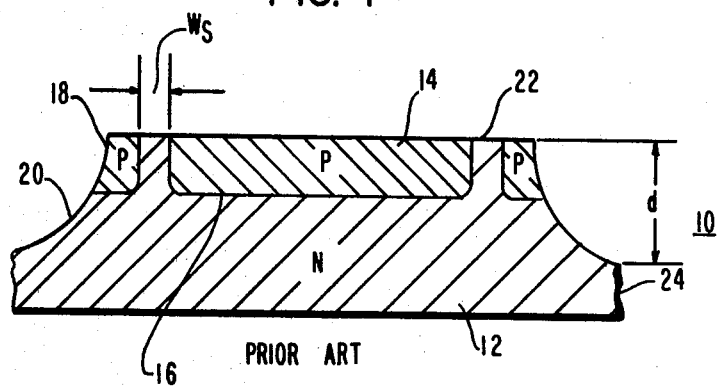
FIG. 1 is a side view in section of a prior art diode.

FIGS. 3 to 5 are sectional views of a body of semiconductor material being processed in accordance with a manufacturing method in accordance with the teachings of this invention.

As shown in FIG. 3, boron is diffused selectively thin into n-type silicon substrate 50 to form a first p-type diffused layer or region 52 and a second p-type diffused layer or region 54 surrounding the first p-type diffused layer 52 but keeping a fixed distance between regions 52 and 54. The surface of the second p-type diffused layer or region 54 is etched slightly to remove the high density of surface layer of boron. In this case, it is proper to make the diffusion depth 5 to 10μ and the etching depth 2 to 3μ.

As shown in FIG. 4, by driving the first p-type diffused layer or region 52 deeper into the body 50, the depth of the diffused layer 52 is made to reach a depth of about 60μ to form the first region 152.

At the same time, the second p-type diffused region 54 is driven into the body 50 to reach a depth of about 30-40μ. This forms the guard ring region 154. Herewith, between the first region 152 and the guard ring region 154, distinct difference in diffusion depth appears.

Next, as shown in FIG. 5, the mesa portion 156 is formed by etching a bevel 158 into a part of guard ring region 154. As above, if the guard ring region 154 is made thin, the desired high withstand voltage diode can be obtained by only forming the depth of mesa part 156 to a depth of about 70-80μ.

In the case where resistivity of the n-type silicon substrate 50 is about 80 Ωcm, Ws is about 50μ and the depth of the first region 152 is 60μ, 100μ to 130μ depth of mesa part d is required to obtain the withstanding voltage 1600 to 1800 V in the conventional device shown in FIG. 1, but in the device of this invention, the same value of withstanding voltage is obtained with a 70 to 80μ depth d of mesa 156.

As described above, a high withstanding voltage is obtained even though the depth d of mesa part 156 is made thin. This is achieved by making the depth of guard ring region 154 relatively shallow, and the danger of the body of silicon breaking is lessened.

This invention is not limited to a device structured by the manufacturing method shown above, for example, the diffusion depth of guard ring region 154 can be made thinner than the first region 152 by injecting n-type impurities into the second p-type diffused layer 54 by known ion injecting method to reduce the impurity density of the region.

In another method, diffuse the first p-type diffused layer or region 52 and the second p-type diffused layer 54 to a shallow depth, and next, diffuse further p-type impurities only into the first p-type diffused layer 52 through a mask having smaller opening, and thereby, the diffusion depth of guard ring region 154 can be thinner than that of the first region 152. The purpose of making the opening of the mask smaller than the surface of the first p-type diffusion 52 is so Ws, the distance between regions 52 and 54 is not changed.

Figure 2:
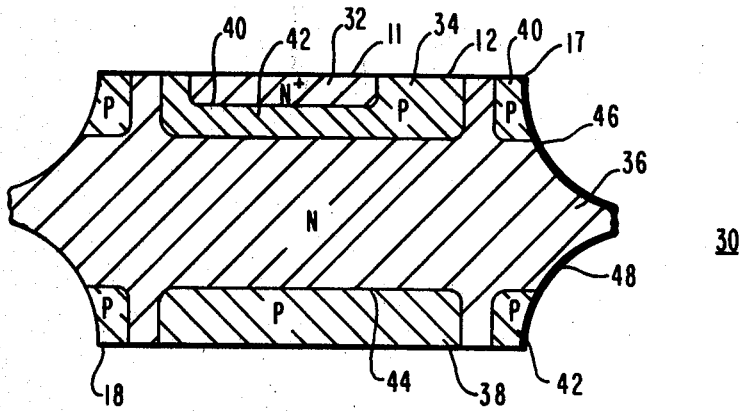
FIG. 2 is a side view in section of a prior art thyristor.
Figure 6:
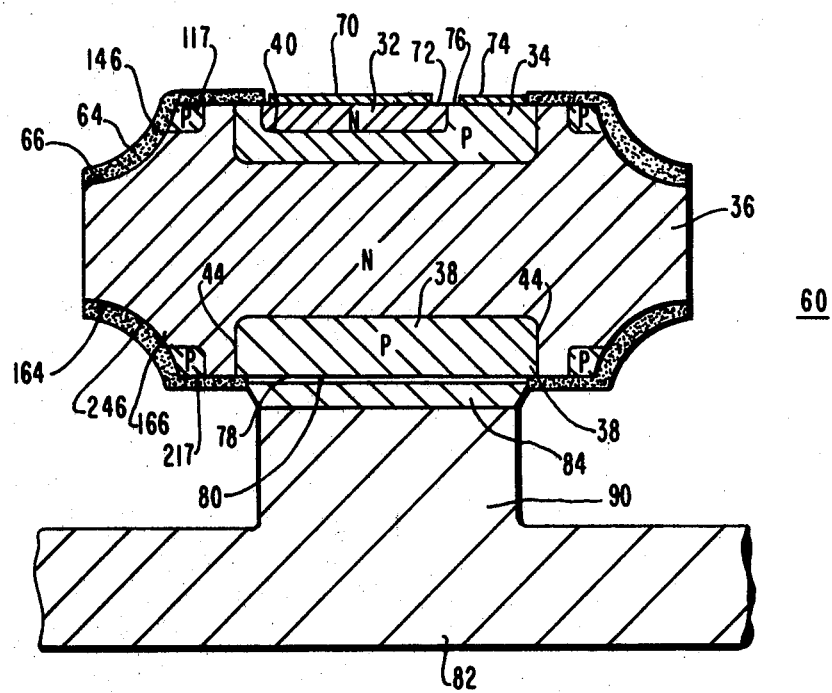
FIG. 6 is a side view of thyristor prepared in accordance with the teachings of this invention.

FIG. 6 is a sectional view showing a thyristor 60 that was manufactured by the same manufacturing method as above and is attached to a heat sink. In the FIG. 6, the same symbols as those of FIG. 2 show corresponding parts, and we described about only different portion from the thyristor in FIG. 2.

That is, 117 is a first guard ring region provided at a first mesa part 146, 217 the second guard ring region provided at the second mesa part 246, 64 a first passivation film formed on the surface 66 of the bevel and extends to the exposed terminal of PN junction 40 between by p-type cathode base region 34 and n-type cathode emitter region 32, 164 a second passivation film formed on surface 166 which extends to the exposed terminal of PN junction 44 formed by p-type anode emitter region 38 and n-type anode base region 36 from the second mesa part 246.

Reference numeral 70 is a first metalize electrode provided on surface 72 of n-type cathode emitter 32, a second metalize electrode 74 is provided on surface 76 of p-type cathode base region 34, 78 is a third metalize electrode provided on surface 80 of p-type anode emitter layer 38, 82, a heat sink is affixed to region 38 by a solder layer 84.

When attaching the thyristor 60 to the heat sink 82, as illustrated in FIG. 6, some consideration is required to prevent a discharge between n-type anode base region 36 of the thyristor and the heat sink 82 by covering the exposed surface of PN junction 44 between p-type anode emitter region 38 and n-type anode base region 36 with the second passivation film 164, and by providing the heat sink 82 with a platan portion 90 thus decreasing the cross-sectional area at the interface.

I claim as my invention:

1. A mesa-type semiconductor device comprising a body of semiconductor material, said body having a top surface, a bottom surface and an edge portion extending between said top and bottom surfaces, a first region, having a first-type of conductivity, extending from a portion of said top surface into said body to a depth less than the thickness of said body, a second region having a second type of conductivity, said second region forming a p-n junction with said first region, said second region extending to said top surface around said first region, a third region, said third region having said first type of conductivity, said third region extending from said top surface into said body to a depth less than said first region, said third region being spaced apart from said first region by said second region, the edge portion of said body being beveled from said top surface, adjacent to said third region, to a depth equal to approximately twice the depth of said third region.

2. The semiconductor device of claim 1 in which the device is a diode and first region is an anode region, the second region is a cathode region and the third region is a guard ring.

3. A mesa-type thyristor comprising a body of semiconductor material, said body having a top surface, a bottom surface and an edge portion extending therebetween, said body comprised of four regions of alternating type of conductivity with a p-n junction between adjacent regions, the four regions comprising an anode emitter region, an anode base region, a cathode base region and a cathode emitter region, said anode emitter region extending to said top surface of said body, said anode base region extending to said top surface of said body and surrounding said anode emitter region at said top surface, said cathode emitter region extending to said bottom surface of said body, said cathode base region extending to said bottom surface of said body and surrounding said cathode emitter region at said bottom surface, said anode base region extending to said bottom surface and surrounding said cathode base region on said bottom surface, a fifth region extending from said top surface into said body to a depth less than said anode emitter region, said fifth region having the same type of conductivity as said anode emitter region, said fifth region being spaced apart from said anode emitter region by said anode base region, a sixth region extending from said bottom surface into said body to a depth less than said cathode emitter region, said sixth region having the same type of conductivity as said anode emitter region, said sixth region being disposed within said anode base region and being spaced apart from said cathode emitter region by both said cathode base region and said anode base region, said edge portion having a first bevel portion extending from said top surface adjacent said fifth region to a depth equal to approximately twice the depth of said fifth region and a second bevel portion extending from said bottom surface adjacent said sixth region to a depth equal to approximately twice the depth of said sixth region, said first and said second bevel portions being spaced apart on said edge portion by a portion of said anode base region.

* * * * *